United States Patent [19]
Hebert

[11] Patent Number: 6,137,138
[45] Date of Patent: Oct. 24, 2000

[54] MOSFET POWER TRANSISTOR HAVING OFFSET GATE AND DRAIN PADS TO REDUCE CAPACITANCE

[75] Inventor: Francois Hebert, San Mateo, Calif.

[73] Assignee: Spectrian Corporation, Sunnyvale, Calif.

[21] Appl. No.: 09/036,484

[22] Filed: Mar. 6, 1997

[51] Int. Cl.[7] .......................... H01L 31/119; H01L 29/76
[52] U.S. Cl. .......................... 257/341; 257/343; 257/401
[58] Field of Search .................................... 257/341, 342, 257/343, 401, 786, 331; 438/612, 666, 587, 588

[56] References Cited

U.S. PATENT DOCUMENTS

| | | | |
|---|---|---|---|
| 5,192,989 | 3/1993 | Matsushita et al. | 257/342 |
| 5,886,372 | 3/1999 | Kai et al. | 257/341 |

OTHER PUBLICATIONS

Alan Wood et al., "High Performance Silicon LDMOS Technology for 2GHz RF Power Amplifier Applications", Technical Digest, IEDM Conference 1996, pp. 87–90.

Gordon Ma et al., "High Efficiency LDMOS Power FET for Low Voltage Wireless Communications", Technical Digest, IEDM Conference 1996, pp. 91–94.

*Primary Examiner*—Steven H. Loke
*Assistant Examiner*—Hung K. Vu
*Attorney, Agent, or Firm*—Townsend and Townsend and Crew LLP; Henry K. Woodward

[57] ABSTRACT

In an RF/microwave power amplifier comprising a linear array of MOSFET transistors in a semiconductor substrate, the transistors having gate and drain bond pads between adjacent transistors, drain to gate feedback capacitance is reduced by offsetting the drain bond pads from the gate bond pads. Bond wires to the drain bond pads extend in the offset direction from the drain bond pads, and bond wires to the gate bond pads extend from the gate bond pads in the opposite direction to reduce capacitive coupling between the bond wires and reduce the length of the bond wires.

14 Claims, 4 Drawing Sheets

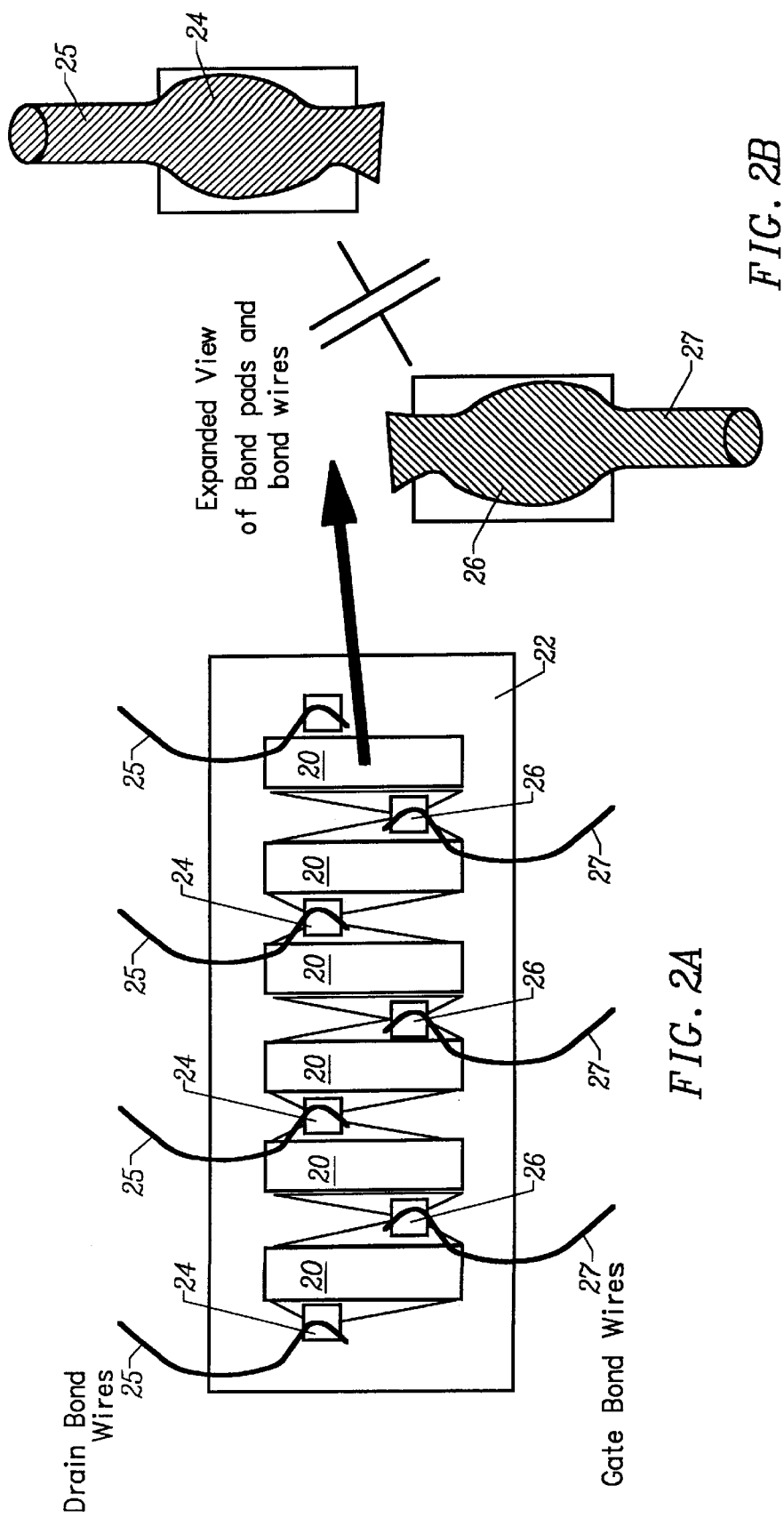

– –
MOSFET POWER TRANSISTOR HAVING OFFSET GATE AND DRAIN PADS TO REDUCE CAPACITANCE

BACKGROUND OF THE INVENTION

This invention relates generally to MISFET (MOSFET) transistors, and more particularly the invention relates to a MOSFET structure having reduced gate to drain feedback capacitance.

The MISFET transistor, more commonly known as a MOSFET, includes a source and drain region separated by a channel region with the conductance of the channel region controlled by a voltage bias applied to a gate electrode over the channel. Ohmic contacts are made to each of the source, drain, and gate of a transistor in circuit applications.

Discrete MOSFET devices are well suited for RF/microwave power applications. The gate to drain feedback capacitance ($C_{gd}$ or $C_{rss}$) of any MOSFET transistor device must be minimized in order to maximize RF signal gain and minimize signal distortion. The gate to drain feedback capacitance is critical since it is effectively multiplied by the voltage gain of the device, or $C_{effective} = C_{rss}(1+gmR_1)$ where gm is the transconductance and $R_1$, is the load impedance.

Attempts to minimize the gate to drain feedback capacitance includes the use of a Faraday shield made of metal or polysilicon which is formed over the gate structure and typically is connected to the source region. See for example, Technical Digest IEDM Conference 1996, pgs. 87–90 which describe a 2 GHz RF LDMOS transistor and pgs. 91–94 which describe a 1 GHz RF LDMOS transistor. FIG. 1A shows a plurality of RF/microwave power MOSFET transistors in a semiconductor body 12 with bonding pads provided between adjacent transistors with the bonding pads having capacitive coupling as illustrated in FIG. 1B. In these devices a plurality of MOSFET transistors are linearly arranged in a semiconductor body 12 with shared gate bond pads 16 and drain bond pads 15 provided between adjacent transistors on a major surface of a semiconductor body. All of the bond pads are generally linearly arranged, and bond wires 15, 17 contact the respective drain pads and gate pads, as illustrated in the plan view of FIG. 1 of the drawing. The close proximity of the bond pads and the bond wires provides a coupling capacitance between the drain and gate which is not negligible. For example, the Crss component from gate to drain bond wires is estimated at greater than 10% of the total gate-drain capacitance for a drain to source voltage greater than 10 volts.

The present invention is directed to an integrated MOSFET transistor device having reduced gate to drain feedback capacitance.

SUMMARY OF THE INVENTION

In accordance with the invention, an integrated MOSFET semiconductor device includes a plurality of MOSFET transistors formed in a semiconductor body in a generally linear arrangement with each transistor having a drain bond pad and a gate bond pad on the device surface with each bond pad positioned between adjacent transistors. The drain bond pads are generally linearly arranged and the gate bond pads are generally linearly arranged and offset from the drain bond pads, thereby reducing gate to drain feedback capacitance. Bond wires to the drain bond pads extend from the device surface in one direction, and bond wires to the gate bond pads extend from the device surface in a second direction opposite to the first direction, thereby further reducing capacitive coupling. Preferably, the drain bond pads are offset from the gate bond pads in the direction of the drain wire bonds.

In one embodiment, the bond pads are formed on thick oxide to reduce pad to substrate capacitance with each bond pad shared by adjacent transistors.

The invention and objects and features thereof will be more readily apparent from the following detailed description and appended claims when taken with the drawing.

BRIEF DESCRIPTION OF THE DRAWINGS

FIG. 2A and FIG. 2B are a plan view of an RF/microwave power MOSFET device in accordance with one embodiment of the present invention, and the gate to drain capacitance thereof.

DETAILED DESCRIPTION OF THE ILLUSTRATIVE EMBODIMENTS

Figures 1A, 1B:
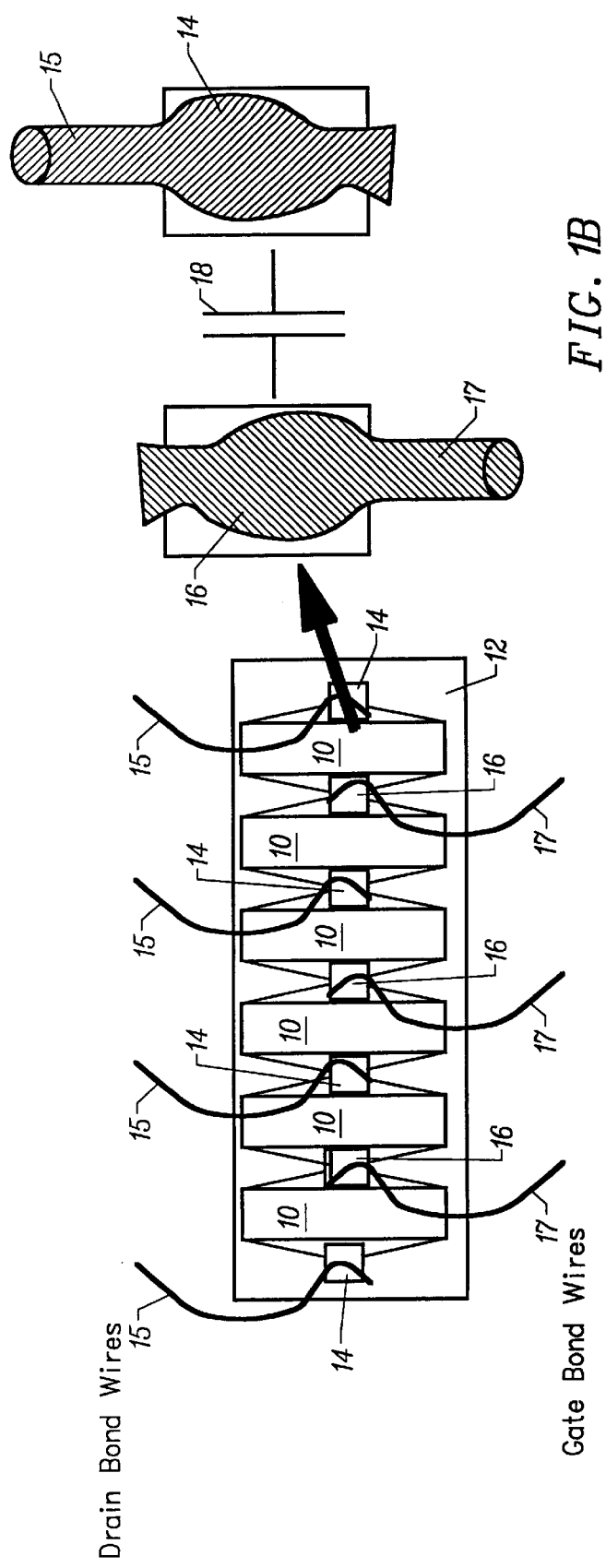
FIG. 1A and FIG. 1B are a plan view of an RF/microwave power MOSFET transistor device and a schematic of gate to drain capacitive coupling in accordance with the prior art.

FIG. 2A is a plan view of an RF/microwave power MOSFET device in accordance with one embodiment of the present invention, and FIG. 2B illustrates the capacitive coupling between gate and drain bond pads and bond wires thereof. The arrangement of transistors 20 in a semiconductor body 22 is similar to the arrangement of transistors 10 in semiconductor body 12 of FIG. 1A, but in FIG. 2A the bond pads 24 are linearly arranged and offset from the gate bond pads 26 with the offset of the drain bond pads being in the direction of the drain bond wires 25. This offset of the drain bond pads and wires from the gate bond pads and wires spaces the pads and wires further apart and thus reduces the capacitive coupling between the source and drain bond pads and bond wires as illustrated in FIG. 2B. Further, since the bond pads are closer to the periphery of the die, the bond wire inductance is further reduced.

Figure 3:
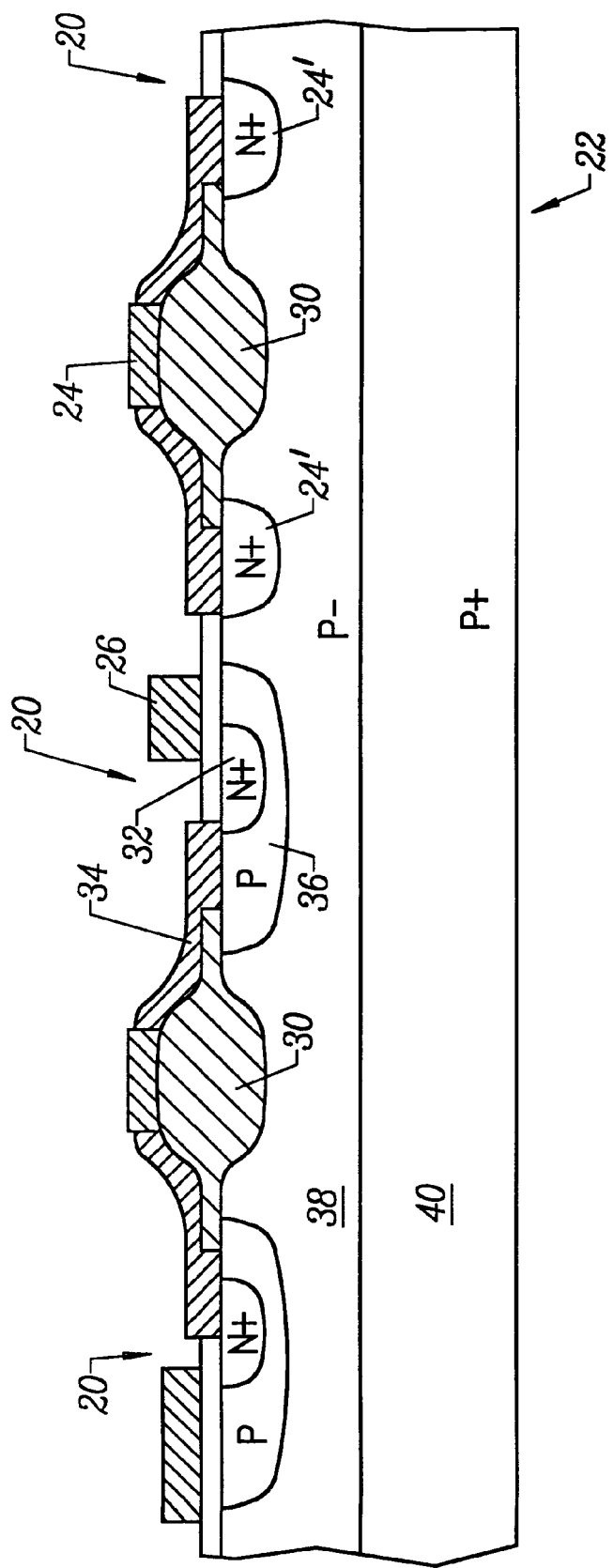
FIG. 3 is a section view of a portion of the device of FIG. 2A illustrating the positioning of bond pads on thick field oxide in accordance with one embodiment of the invention.

FIG. 3 is a section view of a portion of the transistor device of FIG. 2A with the semiconductor body 22 comprising a P+ substrate and a P− epitaxial layer and the transistors 20 comprising LDMOS transistors. To further reduce bond pad capacitance to the underlying substrate, the drain bond pads 24 are formed on thick field oxide 30 between adjacent transistors 20 with metal lines connecting the bond pads 24 to the drain regions 24' of the transistors. The gate bond pads 26 are preferably formed over a deposited dielectric layer of silicon oxide and silicon nitride to minimize pad to substrate capacitance.

Figure 4:
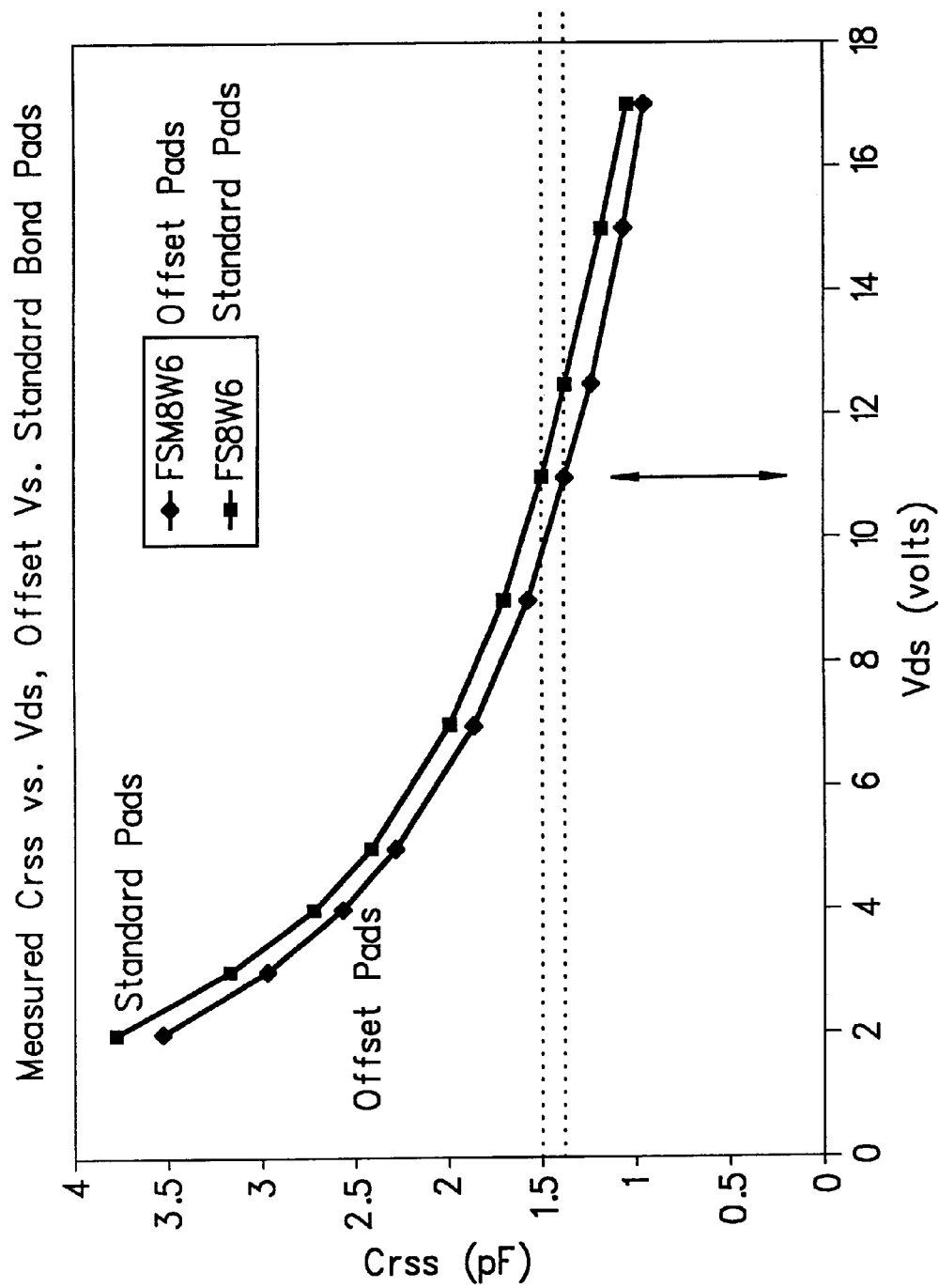
FIG. 4 is a plot of measured Crss vs. $V_{dss}$ for standard bond pads and offset bond pads in accordance with the invention.

FIG. 4 is a plot illustrating measured gate to drain capacitance (Crss) versus drain to source voltage ($V_{dss}$) for offset bond pads in accordance with the invention versus standard in-line bond pads. Crss for the offset pads is consistently lower than Crss for standard pads over the voltage range with the reduction being approximately 7% for $V_{dss}$ greater than 10 volts.

The reduction of gate to drain feedback capacitance using offset drain and gate bond pads in accordance with the invention is significant, particularly for RF and microwave power MOSFET transistors. The use of offset drain bond pads and gate bond pads significantly reduces the feedback capacitance between the drain and gate regions. Further, no change in process or device structure is required in implementing the invention in existing product lines. Additionally, inductance of wire bonds can be reduced since the length of the wire bonds is less when using offset bond pads.

While the invention has been described with reference to specific embodiments, the description is illustrative of the invention as not to be construed as limiting the invention. For example, the bond pad separation can be varied between adjacent transistors in a transistor array. Thus, the description is illustrative of the invention and is not to be construed as limiting the invention. Various modifications and applications may occur to those skilled in the art without departing from the true spirit and scope of the invention as defined by the appended claims.

What is claimed is:

1. An RF microwave integrated lateral DMOS power semiconductor transistor device with reduced bonding pad coupling comprising:

a) a semiconductor body having a major surface, b) a plurality of lateral DMOS transistors formed in the semiconductor body in a linear arrangement, c) each transistor having a drain bond pad and a gate bond pad on the major surface with each bond pad positioned between adjacent transistors, the drain bond pads being generally linearly arranged and the gate bond pads being generally linearly arranged and offset from the drain bond pads, thereby reducing gate to drain feedback capacitance.

2. The integrated semiconductor transistor device as defined by claim 1 wherein the offset is varied between transistors.

3. The integrated semiconductor transistor device as defined by claim 1 wherein each bond pad is shared by adjacent transistors.

4. The integrated semiconductor transistor device as defined by claim 3 and further including bond wires contacting the bond pads.

5. The integrated semiconductor transistor device as defined by claim 4 wherein the bond wires to drain bond pads extend from the major surface in one direction, and the bond wires to the gate bond pads extend from the major surface in a second direction opposite to the first direction to thereby further reduce capacitive coupling of the wires and reduce length and inductance of the wires.

6. The integrated semiconductor transistor device as defined by claim 5 wherein the drain bond pads are offset from the gate bond pads in the one direction.

7. The integrated semiconductor transistor device as defined by claim 6 and further including a thick field oxide on the major surface, the drain bond pads being formed on the thick oxide to reduce pad to substrate capacitance.

8. The integrated semiconductor transistor device as defined by claim 7 and further including a deposited dielectric on the major surface under the gate bond pads, the gate pads being formed on thick oxide to reduce substrate capacitance.

9. The integrated semiconductor transistor device as defined by claim 7 and further including a deposited dielectric on the major surface under the gate bond pads.

10. The integrated semiconductor transistor device as defined by claim 1 and further including bond wires contacting the bond pads.

11. The integrated semiconductor transistor device as defined by claim 9 wherein the bond wires to the drain bond pads extend from the major surface in one direction and the bond wires to the gate bond pads extend from the major surface in a second direction opposite to the first direction thereby reducing capacitive coupling of the bond wires and reducing length and inductance of the wires.

12. The integrated semiconductor transistor device as defined by claim 10 wherein the drain bond pads are offset from the gate bond pads in the one direction.

13. The integrated semiconductor transistor device as defined by claim 1 and further including a thick field oxide on the major surface, the drain bond pads being formed on the thick oxide to reduce pad to substrate capacitance.

14. The integrated semiconductor transistor device as defined by claim 1 wherein said device comprises an RF/microwave power amplifier.

* * * * *

UNITED STATES PATENT AND TRADEMARK OFFICE
CERTIFICATE OF CORRECTION

PATENT NO. : 6,137,138
APPLICATION NO. : 09/036484
DATED : October 24, 2000
INVENTOR(S) : Herbert Page 1 of 1

It is certified that error appears in the above-identified patent and that said Letters Patent is hereby corrected as shown below:

On the Title Page:

Item 22: Please correct Filing Date "March 6, 1997" to read --March 6, 1998--

Signed and Sealed this

Twenty-ninth Day of July, 2008

JON W. DUDAS
*Director of the United States Patent and Trademark Office*